US011164880B2

United States Patent
Lo et al.

(10) Patent No.: US 11,164,880 B2
(45) Date of Patent: Nov. 2, 2021

(54) MULTI-TIME PROGRAMMING NON-VOLATILE MEMORY

(71) Applicant: eMemory Technology Inc., Hsin-Chu (TW)

(72) Inventors: Chun-Yuan Lo, Hsinchu County (TW); Shih-Chen Wang, Hsinchu County (TW); Wen-Hao Ching, Hsinchu County (TW); Chih-Hsin Chen, Hsinchu County (TW); Wei-Ren Chen, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 83 days.

(21) Appl. No.: 16/369,686

(22) Filed: Mar. 29, 2019

(65) Prior Publication Data
US 2020/0006508 A1 Jan. 2, 2020

Related U.S. Application Data

(60) Provisional application No. 62/690,894, filed on Jun. 27, 2018.

(51) Int. Cl.
*H01L 27/11517* (2017.01)
*G11C 16/04* (2006.01)
(Continued)

(52) U.S. Cl.
CPC .... *H01L 27/11517* (2013.01); *G11C 16/0416* (2013.01); *G11C 16/0433* (2013.01);
(Continued)

(58) Field of Classification Search
CPC ......... H01L 27/11558; H01L 27/11517; H01L 27/11519; H01L 27/11524;
(Continued)

(56) References Cited

U.S. PATENT DOCUMENTS 8,355,282 B2 * 1/2013 Ching ............... H01L 27/11519
365/185.15
2006/0220096 A1 10/2006 Wang et al.
(Continued)

FOREIGN PATENT DOCUMENTS

CN 101110268 A 1/2008
CN 102376719 A 3/2012

OTHER PUBLICATIONS

Office action issued by TIPO dated Oct. 28, 2019.
Office Action issued by China National Intellectual Property Administration dated Jun. 11, 2021.

*Primary Examiner* — Shahed Ahmed
*Assistant Examiner* — Sun Mi Kim King
(74) *Attorney, Agent, or Firm* — WPAT, PC (57) ABSTRACT

A multi-time programming non-volatile memory includes a select transistor, a floating gate transistor, a switch transistor, a capacitor and an erase gate element. The select transistor is connected with a select line and a source line. The floating gate transistor includes a floating gate. The floating gate transistor is connected with the select transistor. The switch transistor is connected with a word line, the floating gate transistor and a bit line. A first terminal of the capacitor is connected with the floating gate. A second terminal of the capacitor is connected with a control line. The erase gate element includes the floating gate, a gate oxide layer and a p-type region. The erase gate element is connected with an erase line. The floating gate of the erase gate element at least includes an n-type floating gate part.

3 Claims, 5 Drawing Sheets

(51) Int. Cl.
*G11C 16/12* (2006.01)
*G11C 16/10* (2006.01)
*G11C 16/14* (2006.01)
*G11C 16/26* (2006.01)
*H01L 27/11524* (2017.01)
*H01L 49/02* (2006.01)
*H01L 29/10* (2006.01)
*H01L 29/423* (2006.01)
*H01L 29/788* (2006.01)
*H01L 27/11519* (2017.01)
*H01L 29/49* (2006.01)

(52) U.S. Cl.
CPC .............. *G11C 16/10* (2013.01); *G11C 16/12* (2013.01); *G11C 16/14* (2013.01); *G11C 16/26* (2013.01); *H01L 27/11519* (2013.01); *H01L 27/11524* (2013.01); *H01L 28/40* (2013.01); *H01L 29/1095* (2013.01); *H01L 29/42324* (2013.01); *H01L 29/42328* (2013.01); *H01L 29/788* (2013.01); *H01L 29/7885* (2013.01); *G11C 2216/04* (2013.01); *H01L 29/4916* (2013.01)

(58) Field of Classification Search
CPC ......... H01L 27/11521; H01L 27/11526; H01L 21/28105; H01L 29/42328; H01L 29/788; H01L 29/66825; H01L 29/7881; G11C 16/0433; G11C 16/10; G11C 16/14; G11C 16/26; G11C 16/0416; G11C 16/12; G11C 2216/04; G11C 16/045; G11C 16/0425; G11C 2216/10
See application file for complete search history.

(56) References Cited

U.S. PATENT DOCUMENTS

2017/0301682 A1 10/2017 Li et al.
2018/0102174 A1* 4/2018 Lin .................... H01L 29/4975

* cited by examiner

| | CL | SGL | WL | EL/NW2 | BL | SL | PW2 |
|---|---|---|---|---|---|---|---|
| PGM | Vpp | Vdd | Vdd | Vpp | 0V | 0V | 0V |
| ERS | 0V | Vdd | Vdd | Vee | 0V | 0V | Vee |
| READ | 0V | Vdd | Vdd | 0V | Vrr | 0V | 0V |

MULTI-TIME PROGRAMMING NON-VOLATILE MEMORY

This application claims the benefit of U.S. provisional application Ser. No. 62/690,894, filed Jun. 27, 2018, the subject matters of which are incorporated herein by references.

FIELD OF THE INVENTION

The present invention relates to a non-volatile memory, and more particularly to a multi-time programming non-volatile memory.

BACKGROUND OF THE INVENTION

As is well known, a non-volatile memory is able to continuously retain data even the supplied power is cut. Consequently, the non-volatile memory is widely used in a variety of electronic products.

Generally, after the non-volatile memory leaves the factory, the user may program the non-volatile memory in order to record data into the memory cells of the non-volatile memory. According to the number of times the non-volatile memory is programmed, the non-volatile memories may be classified into a one time programming non-volatile memory (also referred as an OTP memory) and a multi-time programming non-volatile memory (also referred as a MTP memory).

Generally, the OTP memory can be programmed once. After the OTP memory is programmed, the stored data of the OTP memory cannot be modified. On the contrary, the user may program and erase the MTP memory. Consequently, the stored data of the MTP memory can be modified multiple times.

For example, the OTP memory can be implemented through an antifuse transistor. During the program cycle, a gate oxide layer of the antifuse transistor is selectively ruptured. In addition, a storage state of the OTP memory is determined according to whether the gate oxide layer is ruptured. Once the gate oxide layer is ruptured, the gate oxide layer cannot be restored. Consequently, the non-volatile memory with the antifuse transistor is usually used as the OTP memory.

For example, the MTP memory can be implemented through a floating gate transistor. By properly controlling the floating gate transistor, hot carriers are injected into or ejected from a floating gate of the floating gate transistor, and the storage state of the MTP memory is correspondingly determined. Consequently, the non-volatile memory with the floating gate transistor is usually used as the MTP memory.

SUMMARY OF THE INVENTION

An embodiment of the present invention provides a multi-time programming non-volatile memory. The multi-time programming non-volatile memory includes a select transistor, a floating gate transistor, a switch transistor, a capacitor and an erase gate element. A gate terminal of the select transistor is connected with a select line. A first source/drain terminal of the select transistor is connected with a source line. The floating gate transistor includes a floating gate. A first source/drain terminal of the floating gate transistor is connected with a second source/drain terminal of the select transistor. A gate terminal of the switch transistor is connected with a word line. A first source/drain terminal of the switch transistor is connected with a second source/drain terminal of the floating gate transistor. A second source/drain terminal of the switch transistor is connected with a bit line. A first terminal of the capacitor is connected with the floating gate. A second terminal of the capacitor is connected with a control line. The erase gate element includes the floating gate, a gate oxide layer and a p-type region. The erase gate element is connected with an erase line. The floating gate of the erase gate element at least includes an n-type floating gate part.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 10 is a bias voltage table illustrating the bias voltages for performing a program action, an erase action and a read action on the memory cell of the MTP memory as shown in FIG. 1A;

DETAILED DESCRIPTION OF PREFERRED EMBODIMENTS

Figure 1A:
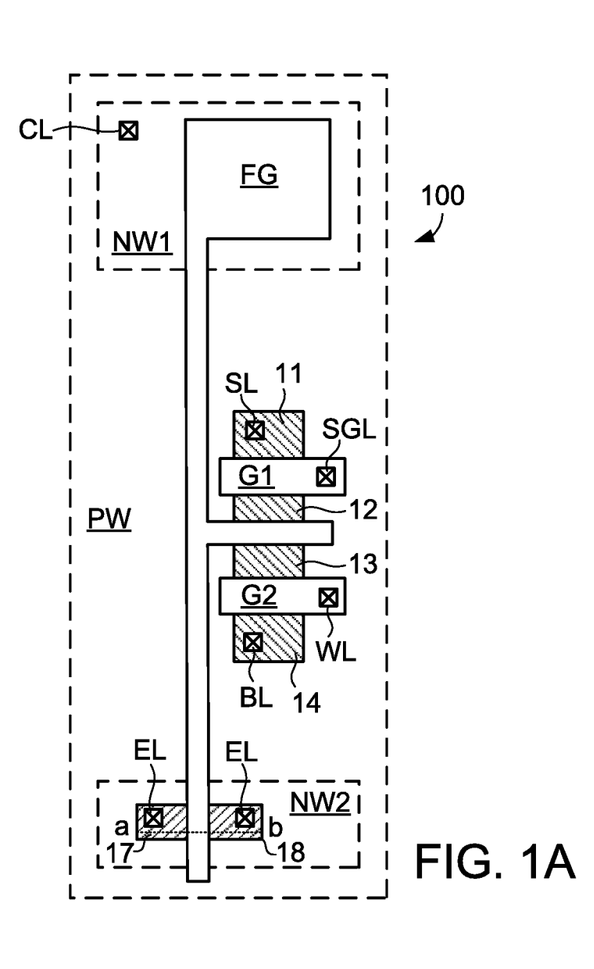
FIG. 1A is a schematic top view illustrating a MTP memory according to an embodiment of the present invention.
Figure 1B:
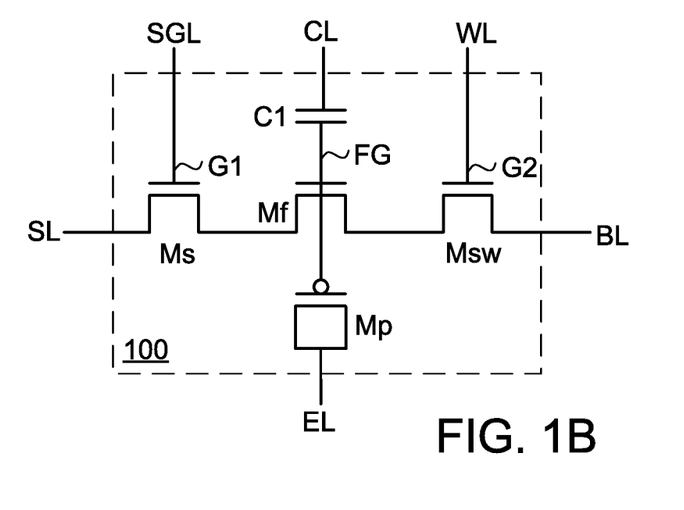
FIG. 1B is a schematic equivalent circuit diagram of the MTP memory as shown in FIG. 1A.

Please refer to FIGS. 1A, 1B and 10. FIG. 1A is a schematic top view illustrating a MTP memory according to a first embodiment of the present invention. FIG. 1B is a schematic equivalent circuit diagram of the MTP memory as shown in FIG. 1A. FIG. 10 is a bias voltage table illustrating the bias voltages for performing a program action, an erase action and a read action on the memory cell of the MTP memory as shown in FIG. 1A.

As shown in FIG. 1A, a semiconductor substrate contains a P-well region PW, a first N-well region NW1 and a second N-well region NW2. The first N-well region NW1 and the second N-well region NW2 are formed in the P-well region PW. A first gate G1 and a second gate G2 are disposed over the P-well region PW. A floating gate FG is disposed over the P-well region PW, the first N-well region NW1 and the second N-well region NW2. Moreover, each of the floating gate FG, the first gate G1 and the second gate G2 is made of polysilicon.

After a p-type ion implantation process is performed, a first p-type doped region 17 and a second p-type doped region 18 are formed in the second N-well region NW2. After an n-type ion implantation process is performed, a first n-type doped region 11, a second n-type doped region 12, a third n-type doped region 13 and a fourth n-type doped region 14 are formed in the P-well region PW.

A conductor line (source line) SL is connected with the first n-type doped region 11. A conductor line (bit line) BL is connected with the fourth n-type doped region 14. A conductor line (erase line) EL is connected with the first p-type doped region 17 and the second p-type doped region 18. A conductor line (control line) CL is connected with the first N-well region NW1. A conductor line (select line) SGL is connected with the first gate G1. A conductor line (word line) WL is connected with the second gate G2.

In this embodiment, the floating gate FG is extended to the first N-well region NW1. Moreover, the floating gate FG and the first N-well region NW1 are collaboratively formed as a capacitor C1. That is, a first terminal of the capacitor C1 is connected with the floating gate FG, and a second terminal of the capacitor C1 is connected with the control line CL.

The floating gate FG is also extended to the second N-well region NW2. The floating gate FG, the second N-well region NW2, the first p-type doped region 17 and the second p-type doped region 18 are collaboratively formed as a p-type transistor Mp. That is, the gate terminal of the p-type transistor Mp is connected with the floating gate FG, and the drain terminal and the source terminal of the p-type transistor Mp are connected with the erase line EL. In accordance with a feature of the present invention, the p-type transistor Mp may be considered as an erase gate element, and the floating gate FG, the second N-well region NW2, the first p-type doped region 17 and the second p-type doped region 18 construct a path of ejecting electrons.

As mentioned above, the first n-type doped region 11, the second n-type doped region 12, the third n-type doped region 13 and the fourth n-type doped region 14 are formed in the P-well region PW. The first gate G1 spans the surface between the first n-type doped region 11 and the second n-type doped region 12. The floating gate FG spans the surface between the second n-type doped region 12 and the third n-type doped region 13. The second gate G2 spans the surface between the third n-type doped region 13 and the fourth n-type doped region 14. In other words, three n-type transistors are constructed in the P-well region PW. The three n-type transistors include a first n-type transistor Ms, a second n-type transistor Mf and a third n-type transistor Msw.

The first n-type transistor Ms is a select transistor. The gate terminal G1 of the first n-type transistor Ms is connected with the select line SGL. The first n-type doped region 11 is connected with the source line SL. The second n-type doped region 12 is shared by the first n-type transistor Ms and the second n-type transistor Mf.

The second n-type transistor Mf is a floating gate transistor. The gate terminal FG of the second n-type transistor Mf is a floating gate. The third n-type doped region 13 is shared by the second n-type transistor Mf and the third n-type transistor Msw.

The third n-type transistor Msw is a switch transistor. The gate terminal of the third n-type transistor Msw is connected with the word line WL. The fourth n-type doped region 14 is connected with the bit line BL.

Please refer to the memory cell 100 as shown in FIG. 1B. The gate terminal of the select transistor Ms is connected with the select line SGL. The first source/drain terminal of the select transistor Ms is connected with the source line SL. The first source/drain terminal of the floating gate transistor Mf is connected with the second source/drain terminal of the select transistor Ms. The gate terminal of the switch transistor Msw is connected with the word line WL. The first source/drain terminal of the switch transistor Msw is connected with the second source/drain terminal of the floating gate transistor Mf. The second source/drain terminal of the switch transistor Msw is connected with the bit line BL. The capacitor C1 is connected between the floating gate FG and the control line CL. The gate terminal of the p-type transistor Mp is connected with the floating gate FG. The first source/drain terminal and the second source/drain terminal of the p-type transistor Mp are connected with the erase line EL.

Figure 1C:
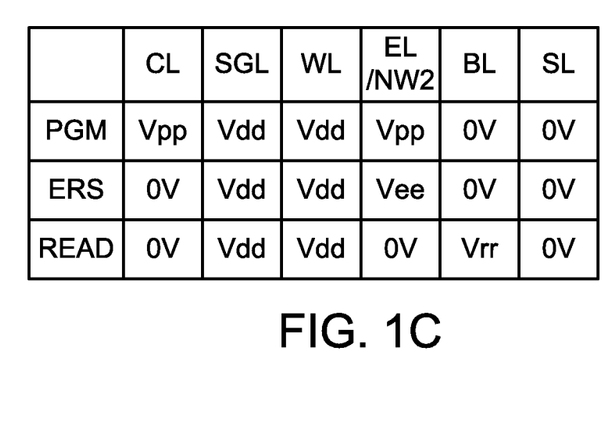

The bias voltages for performing a program action, an erase action and a read action on the memory cell of the MTP memory are listed in the table of FIG. 1C.

When the program action (PGM) is performed, a voltage Vpp is provided to the control line CL and the erase line EL, a voltage Vdd is provided to the word line WL and the select line SGL, and a ground voltage (0V) is provided to the bit line BL and the source line SL. The voltage Vpp is a program voltage, which has a high bias (e.g., 18V). The voltage Vdd is a turn-on voltage (e.g., 3.3V).

During the program action, the word line WL and the select line SGL receives the turn-on voltage. Consequently, the select transistor Ms and the switch transistor Msw are turned on. Since the control line CL and the erase line EL receive the program voltage Vpp, the gate oxide layer of the floating gate transistor Mf in a Fowler-Nordheim tunneling effect (i.e., the FN tunneling effect). Due to the FN tunneling effect, the electrons are injected into the floating gate FG through a channel region of the floating gate transistor Mf and thus the program action is completed. For example, the hot carriers are electrons. After the program action is completed, the hot carriers are stored in the floating gate FG of the floating gate transistor Mf.

When the erase action (ERS) is performed, a voltage Vee is provided to the erase line EL and the second n-well region NW2, a voltage Vdd is provided to the word line WL and the select line SGL, and the ground voltage (0V) is provided to the control line CL, the bit line BL and the source line SL. The voltage Vee is an erase voltage, which has a high bias (e.g., 16V).

During the erase action, the select transistor Ms and the switch transistor Msw are turned on. In addition, the electrons stored in the floating gate FG are transferred through the gate oxide layer of the p-type transistor Mp and ejected from the floating gate FG through the erase line EL and the second N-well region NW2.

When the read action (READ) is performed, a voltage Vrr is provided to the bit line BL, the voltage Vdd is provided to the word line WL and the select line SGL, and the ground voltage (0V) is provided to the control line CL, the bit line BL and the source line SL. The voltage Vrr is a read voltage (e.g., 1V).

During the read action, the select transistor Ms and the switch transistor Msw are turned on. According to the number of electrons on the floating gate FG, the on/off state of the floating gate transistor Mf is determined. In case that the floating gate transistor Mf is turned on, a higher read current is generated and the read current flows from the bit line BL to the source line SL. Whereas, in case that the floating gate transistor Mf is turned off, a lower read current (or nearly zero) is generated. According to the magnitude of the read current, the storage state of the memory cell 100 is determined.

Figures 2A, 2B, 2C, 2D:
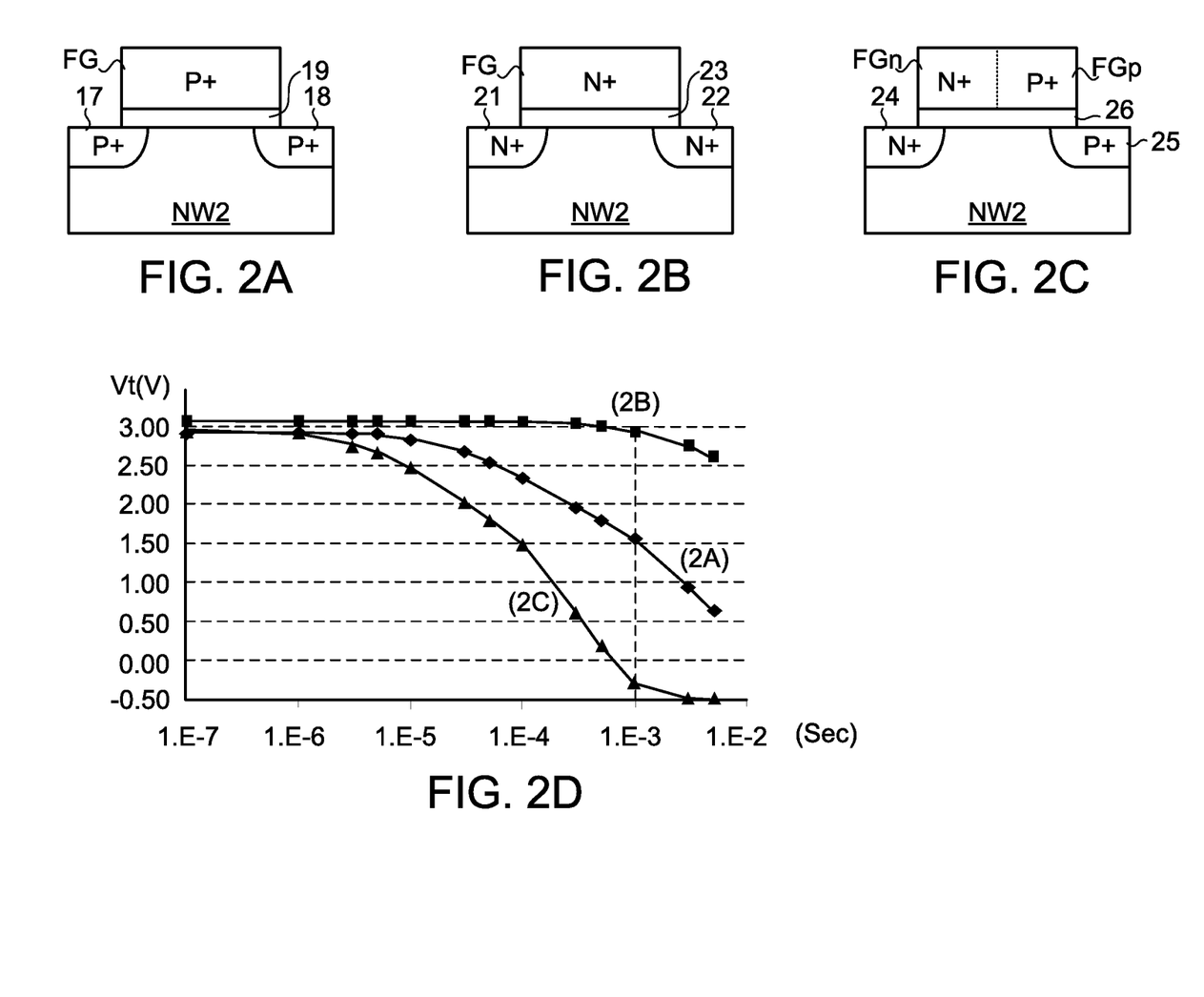
FIG. 2A is a schematic cross-sectional view illustrating an erase gate element of the MTP memory according to the first embodiment of the present invention and taken along the dotted line ab.
FIG. 2B is a schematic cross-sectional view illustrating an erase gate element of a MTP memory according to a second embodiment of the present invention.
FIG. 2C is a schematic cross-sectional view illustrating an erase gate element of a MTP memory according to a third embodiment of the present invention.
FIG. 2D is a plot illustrating the threshold voltage changes of the floating gate transistors of the MTP memories of the first, second and third embodiments while the erase action is performed.

FIG. 2A is a schematic cross-sectional view illustrating an erase gate element of the MTP memory according to the first embodiment of the present invention and taken along the dotted line ab. As mentioned above, the gate electrode FG of the erase gate element becomes the p-type floating gate after the p-type ion implantation process is performed. In addition, the first p-type doped region 17 and the second p-type doped region 18 are formed in the second N-well region NW2 and respectively arranged beside two opposite sides of the floating gate FG.

The ion implantation process is not restricted to the p-type ion implantation process. For example, in another embodiment, an n-type ion implantation process is feasible. Alternatively, multiple ion implantation processes are performed to form the erase gate element with a diverse structure.

FIG. 2B is a schematic cross-sectional view illustrating an erase gate element of a MTP memory according to a second embodiment of the present invention. Except for the erase gate element, the structure of the MTP memory of this embodiment is similar to the MTP memory of the first embodiment. Component parts and elements corresponding to those of the first embodiment are designated by identical numeral references, and detailed description thereof is omitted.

Likewise, the gate electrode FG is made of polysilicon. After an n-type ion implantation process is performed, the gate electrode FG of the erase gate element becomes an n-type floating gate. In addition, a first n-type doped region 21 and a second n-type doped region 22 are formed in the second N-well region NW2 and respectively arranged beside two opposite sides of the floating gate FG.

FIG. 2C is a schematic cross-sectional view illustrating an erase gate element of a MTP memory according to a third embodiment of the present invention. Except for the erase gate element, the structure of the MTP memory of this embodiment is similar to the MTP memory of the first embodiment. Component parts and elements corresponding to those of the first embodiment are designated by identical numeral references, and detailed description thereof is omitted.

Likewise, the floating gate FG is made of polysilicon. As shown in FIG. 2C, a gate oxide layer 26 is formed on a surface of the second N-well region NW2, and the gate electrode FG is formed on the gate oxide layer 26. In this embodiment, an n-type ion implantation process and a p-type ion implantation process are performed. That is, the gate electrode FG is divided into a first part and a second part. After the n-type ion implantation process is performed, the first part of the gate electrode FG becomes an n-type floating gate FGn. After the p-type ion implantation process is performed, the second part of the gate electrode FG becomes a p-type floating gate FGp. In addition, an n-type doped region 24 is formed in the second N-well region NW2 and arranged beside the n-type floating gate FGn, and a p-type doped region 25 is formed in the second N-well region NW2 and arranged beside p-type floating gate FGp.

FIG. 2D is a plot illustrating the threshold voltage changes of the floating gate transistors of the MTP memories of the first, second and third embodiments while the erase action is performed.

Generally, the magnitude of the threshold voltage Vt of the floating gate transistor is related to the electrons stored in the floating gate FG. Take the n-type floating gate transistor for example. During the program action, the electrons are injected into the floating gate FG and thus the threshold voltage Vt of the floating gate transistor is increased. During the erase action, the electrons are ejected from the floating gate FG and thus the threshold voltage Vt of the floating gate transistor is decreased.

Please refer to FIG. 2D. While the erase action is performed, the threshold voltage Vt of the floating gate transistor in each of the first, second and third embodiments is decreased from about 3V. Since the structures of the erase gate elements are different, the MTP memories of the first, second and third embodiments have different erasing efficiencies.

Please refer to FIG. 2D again. At the erase action has been performed for 3 ms, the threshold voltage Vt of the floating gate transistor in the MTP memory of the third embodiment (see the curve 2C) is decreased to about −0.25V, the threshold voltage Vt of the floating gate transistor in the MTP memory of the first embodiment (see the curve 2A) is decreased to about 1.6V, and the threshold voltage Vt of the floating gate transistor in the MTP memory of the first embodiment (see the curve 2B) is decreased to about 2.8V. In other words, the erase gate element of the MTP memory of the third embodiment has a faster erasing speed and a better erasing efficiency under the same erasing condition.

Figure 3:
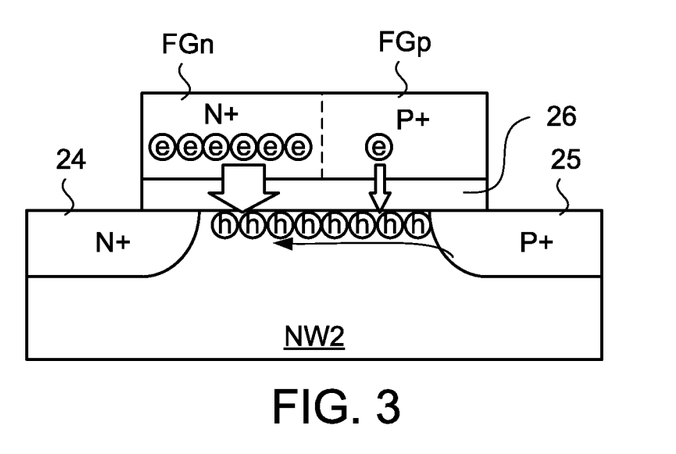
FIG. 3 is a schematic cross-sectional view illustrating the MTP memory according to the third embodiment while the erase action is performed.

FIG. 3 is a schematic cross-sectional view illustrating the MTP memory according to the third embodiment while the erase action is performed. After the program action, the electrons are injected into the gate electrode FG (i.e., the floating gate) of the memory cell of the MTP memory. While the erase action is performed, the p-type doped region 25 provides the minority of carriers (e.g., holes) to the channel region. Since the majority of carriers (e.g., electrons) are stored in the gate electrode FG, an electric field is built across the gate oxide layer 26. For the electrons in the n-type floating gate FGn, the oxide barrier in the gate oxide layer 26 is about 3.1 eV. For the electrons in the p-type floating gate FGp, the oxide barrier in the gate oxide layer 26 is about 4.1 eV.

While the erase action is performed, the paths of the electrons can be seen from FIG. 3. That is, a greater portion of electrons are transferred from the n-type floating gate FGn to the second N-well region NW2 through the gate oxide layer 26, and only a smaller portion of electrons are transferred from the p-type floating gate FGp to the second N-well region NW2 through the gate oxide layer 26.

In the erase gate element of the memory cell, the floating gate FG overlying the gate oxide layer at least comprises a portion of the n-type floating gate FGn, and the underlying region of the gate oxide layer at least comprises a portion of the p-type region. Consequently, the erase gate element has the faster erasing speed and the better erasing efficiency.

According to the above concepts, some variant examples of the erase gate element and the MTP memory with the erase gate element will be described as follows.

Figure 4:
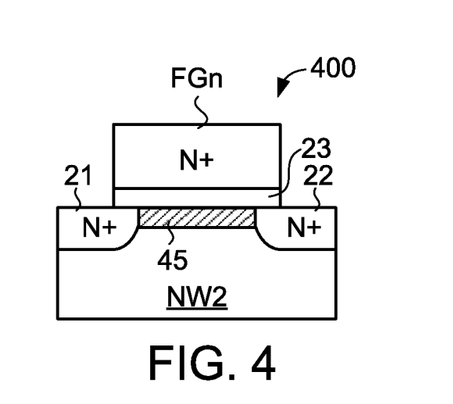
FIG. 4 is a schematic cross-sectional view illustrating an erase gate element of a MTP memory according to a fourth embodiment of the present invention.

FIG. 4 is a schematic cross-sectional view illustrating an erase gate element of a MTP memory according to a fourth embodiment of the present invention. Except for the erase gate element, the structure of the MTP memory of this embodiment is similar to the MTP memory of the second embodiment. Component parts and elements corresponding to those of the first embodiment are designated by identical numeral references, and detailed description thereof is omitted.

In comparison with FIG. 2B, the erase gate element 400 of this embodiment further comprises a p-type implantation region 45. The p-type implantation region 45 is formed in a channel region under a gate oxide layer 23 after a p-type implantation process is performed.

As shown in FIG. 4, the erase gate element 400 comprises an n-type floating gate FGn. A first n-type doped region 21 and a second n-type doped region 22 are formed in the second N-well region NW2 under the gate oxide layer 23 and respectively arranged beside two opposite sides of the n-type floating gate FGn. In addition, the p-type implantation region 45 is arranged between the first n-type doped region 21 and the second n-type doped region 22.

While the erase action is performed, electrons are stored in the floating gate FG and the p-type implantation region 45 provides holes to the channel region. Consequently, an electric field is built across the gate oxide layer 23. During the erase action, the electrons are transferred from the n-type floating gate FGn to the p-type implantation region 45 through the gate oxide layer 23.

Figure 5A:
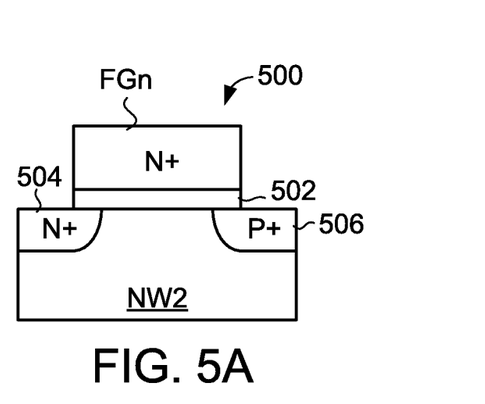
FIG. 5A is a schematic cross-sectional view illustrating an erase gate element of a MTP memory according to a fifth embodiment of the present invention.
Figure 5B:
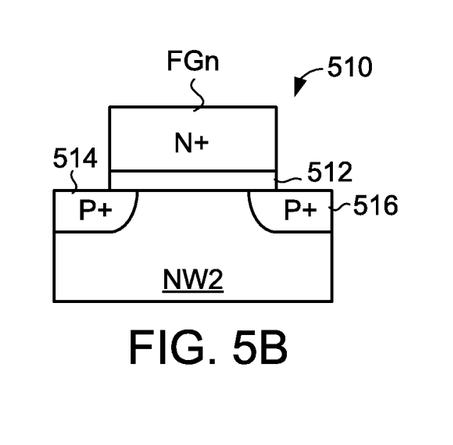
FIG. 5B is a schematic cross-sectional view illustrating an erase gate element of a MTP memory according to a sixth embodiment of the present invention.
Figure 5C:
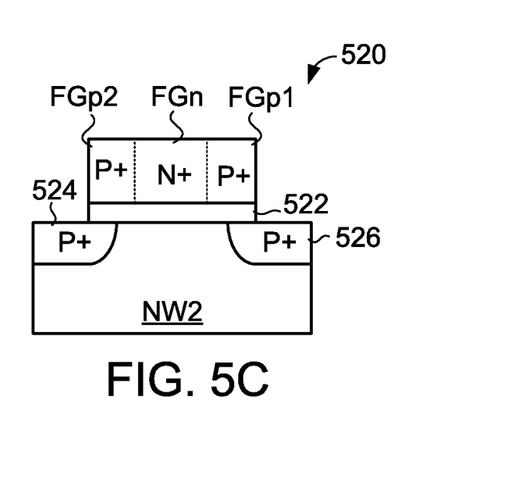
FIG. 5C is a schematic cross-sectional view illustrating an erase gate element of a MTP memory according to a seventh embodiment of the present invention.

FIG. 5A is a schematic cross-sectional view illustrating an erase gate element of a MTP memory according to a fifth embodiment of the present invention. FIG. 5B is a schematic cross-sectional view illustrating an erase gate element of a MTP memory according to a sixth embodiment of the present invention. FIG. 5C is a schematic cross-sectional view illustrating an erase gate element of a MTP memory according to a seventh embodiment of the present invention. Except for the erase gate element, the structure of the MTP memory of the fifth, sixth or seventh embodiment is similar to the MTP memory of the first embodiment. Component parts and elements corresponding to those of the first embodiment are designated by identical numeral references, and detailed description thereof is omitted.

Please refer to the erase gate element 500 of FIG. 5A. After an n-type ion implantation process is performed, the gate electrode of the erase gate element 500 becomes an n-type floating gate FGn. In addition, an n-type doped region 504 is formed in the second N-well region NW2 under a gate oxide layer 502 and arranged beside a first side of the n-type floating gate FGn.

After a p-type ion implantation process is performed, a p-type doped region 506 is formed in the second N-well region NW2 and arranged beside a second side of the n-type floating gate FGn.

While the erase action is performed, electrons are stored in the floating gate FG, and holes are provided from the p-type doped region 506 to the channel region. Consequently, an electric field is built across the gate oxide layer 502. During the erase action, the electrons are transferred from the n-type floating gate FGn to the second N-well region NW2 through the gate oxide layer 502.

Please refer to the erase gate element 510 of FIG. 5B. After an n-type ion implantation process is performed, the gate electrode of the erase gate element 510 becomes an n-type floating gate FGn.

After a p-type ion implantation process is performed, a first p-type doped region 514 and a second p-type doped region 516 are formed in the second N-well region NW2 under a gate oxide layer 512 and respectively arranged beside two opposite sides of the n-type floating gate FGn.

While the erase action is performed, electrons are stored in the floating gate FG, and holes are provided from the p-type doped regions 514 and 516 to the channel region. Consequently, an electric field is built across the gate oxide layer 512. During the erase action, the electrons are transferred from the n-type floating gate FGn to the second N-well region NW2 through the gate oxide layer 512.

Please refer to the erase gate element 520 of FIG. 5C. After an n-type ion implantation process is performed, a middle region of the floating gate of the erase gate element 520 becomes an n-type floating gate FGn.

After a p-type ion implantation process is performed, two lateral regions of the floating gate of the erase gate element 520 become p-type floating gates FGp1 and FGp2, respectively. As shown in FIG. 5C, a first part of the floating gate is the p-type floating gate FGp1, a second part of the floating gate is the n-type floating gate FGn, and a third part of the floating gate is the p-type floating gate FGp2. The n-type floating gate FGn is arranged between the p-type floating gate FGp1 and the p-type floating gate FGp2. In addition, a p-type doped region 524 is formed in the second N-well region NW2 under a gate oxide layer 522 and arranged beside the p-type floating gate FGp1, and a p-type doped region 526 is formed in the second N-well region NW2 under the gate oxide layer 522 and arranged beside p-type floating gate FGp2.

While the erase action is performed, electrons are stored in the n-type floating gate FGn, and holes are provided from the p-type doped regions 524 and 526 to the channel region. Consequently, an electric field is built across the gate oxide layer 522. During the erase action, the electrons are transferred from the n-type floating gate FGn to the second N-well region NW2 through the gate oxide layer 522.

Figures 6A, 6B, 6C:
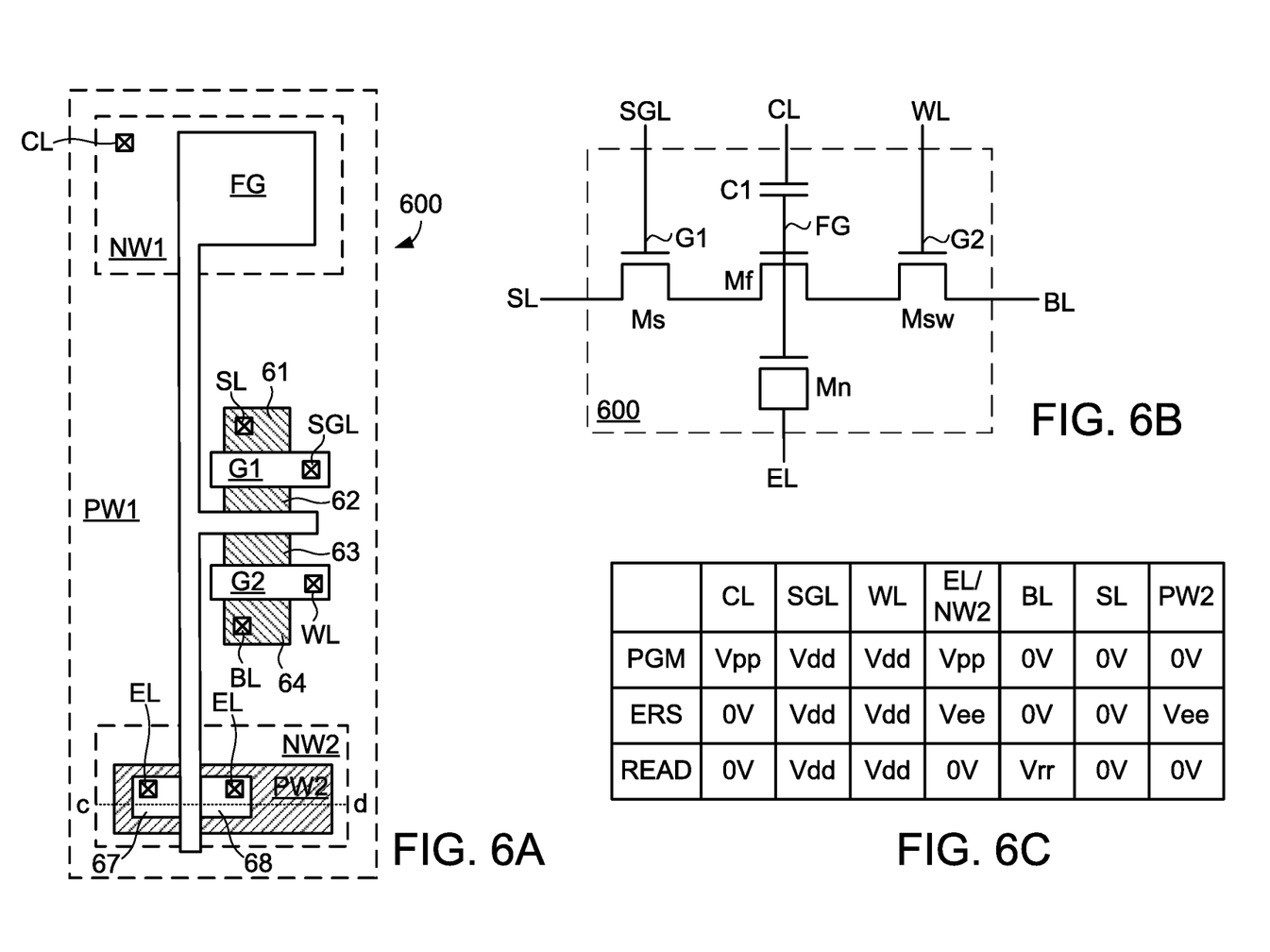
FIG. 6A is a schematic top view illustrating a MTP memory according to an eighth embodiment of the present invention.
FIG. 6B is a schematic equivalent circuit diagram of the MTP memory as shown in FIG. 6A.
FIG. 6C is a bias voltage table illustrating the bias voltages for performing a program action, an erase action and a read action on the memory cell of the MTP memory as shown in FIG. 6A.

Please refer to FIGS. 6A, 6B and 6C. FIG. 6A is a schematic top view illustrating a MTP memory according to an eighth embodiment of the present invention. FIG. 6B is a schematic equivalent circuit diagram of the MTP memory as shown in FIG. 6A. FIG. 6C is a bias voltage table illustrating the bias voltages for performing a program action, an erase action and a read action on the memory cell of the MTP memory as shown in FIG. 6A.

As shown in FIG. 6A, a semiconductor substrate contains a first P-well region PW1, a second P-well region PW2, a first N-well region NW1 and a second N-well region NW2.

The first N-well region NW1 and the second N-well region NW2 are formed in the first P-well region PW1. The second P-well region PW2 is formed in the second N-well region NW2. The second N-well region NW2 is a deep N-well region.

A first gate G1 and a second gate G2 are disposed over the first P-well region PW1. A floating gate FG is disposed over the first P-well region PW1, the first N-well region NW1, the second N-well region NW2 and the second P-well region PW2. Moreover, each of the floating gate FG, the first gate G1 and the second gate G2 is made of polysilicon.

After an n-type ion implantation process is performed, two n-type doped regions 67 and 68 are formed in the second P-well region PW2. After an n-type ion implantation process is performed, the first gate G1 and the second gate G2 as the implantation masks, four n-type doped regions 61, 62, 63 and 64 are formed in the first P-well region PW1.

A conductor line (source line) SL is connected with the first n-type doped region 61. A conductor line (bit line) BL is connected with the fourth n-type doped region 64. A conductor line (erase line) EL is connected with the n-type doped regions 67 and 68. A conductor line (control line) CL is connected with the first N-well region NW1. A conductor line (select line) SGL is connected with the first gate G1. A conductor line (word line) WL is connected with the second gate G2.

In this embodiment, the floating gate FG is extended to the first N-well region NW1. Moreover, the floating gate FG and the first N-well region NW1 are collaboratively formed as a capacitor C1. That is, a first terminal of the capacitor C1 is connected with the floating gate FG, and a second terminal of the capacitor C1 is connected with the control line CL.

The floating gate FG is also extended to the second N-well region NW2 and the second P-well region PW2. The floating gate FG, the second P-well region PW2, the n-type doped region 67 and the n-type doped region 68 are collaboratively formed as an n-type transistor Mn. That is, the gate terminal of the n-type transistor Mn is connected with the floating gate FG, and the drain terminal and the source terminal of the n-type transistor Mn are connected with the erase line EL. In accordance with a feature of the present invention, the n-type transistor Mn may be considered as an erase gate element, and floating gate FG, the second P-well region PW2, the n-type doped region 67 and the n-type doped region 68 construct a path of ejecting the electrons.

As mentioned above, the four n-type doped regions 61, 62, 63 and 64 are formed in the first P-well region PW1. The first gate G1 spans the surface between the n-type doped regions 61 and 62. The floating gate FG spans the surface between the n-type doped regions 62 and 63. The second gate G2 spans the surface between the n-type doped regions 63 and 64. In other words, three n-type transistors are constructed in the first P-well region PW1. The three n-type transistors include a first n-type transistor Ms, a second n-type transistor Mf and a third n-type transistor Msw.

The first n-type transistor Ms is a select transistor. The gate terminal G1 of the first n-type transistor Ms is connected with the select line SGL. The n-type doped region 61 is connected with the source line SL. The n-type doped region 62 is shared by the first n-type transistor Ms and the second n-type transistor Mf.

The second n-type transistor Mf is a floating gate transistor. The gate terminal FG of the second n-type transistor Mf is a floating gate. The n-type doped region 63 is shared by the second n-type transistor Mf and the third n-type transistor Msw.

The third n-type transistor Msw is a switch transistor. The gate terminal G2 of the third n-type transistor Msw is connected with the word line WL. The n-type doped region 64 is connected with the bit line BL.

Please refer to the memory cell 600 as shown in FIG. 6B. The gate terminal of the select transistor Ms is connected with the select line SGL. The first source/drain terminal of the select transistor Ms is connected with the source line SL. The first source/drain terminal of the floating gate transistor Mf is connected with the second source/drain terminal of the select transistor Ms. The gate terminal of the switch transistor Msw is connected with the word line WL. The first source/drain terminal of the switch transistor Msw is connected with the second source/drain terminal of the floating gate transistor Mf. The second source/drain terminal of the switch transistor Msw is connected with the bit line BL. The capacitor C1 is connected between the floating gate FG and the control line CL. The gate terminal of the n-type transistor Mn is connected with the floating gate FG. The first source/drain terminal and the second source/drain terminal of the n-type transistor Mn are connected with the erase line EL.

The bias voltages for performing the program action, the erase action and the read action on the memory cell of the MTP memory of this embodiment are listed in the table of FIG. 6C.

When the program action (PGM) is performed, a voltage Vpp is provided to the control line CL and the erase line EL, a voltage Vdd is provided to the word line WL and the select line SGL, and a ground voltage (0V) is provided to the bit line BL, source line SL and the second P-well region PW2. The voltage Vpp is a program voltage, which has a high bias (e.g., 18V). The voltage Vdd is a turn-on voltage (e.g., 3.3V).

During the program action, the word line WL and the select line SGL receives the turn-on voltage. Consequently, the select transistor Ms and the switch transistor Msw are turned on. Since the control line CL and the erase line EL receive the program voltage Vpp, the gate oxide layer of the floating gate transistor Mf in a Fowler-Nordheim tunneling effect (i.e., the FN tunneling effect). Due to the FN tunneling effect, electrons are injected into the floating gate FG through a channel region of the floating gate transistor Mf and thus the program action is completed. For example, the hot carriers are electrons. After the program action is completed, the hot carriers are stored in the floating gate FG of the floating gate transistor Mf.

When the erase action (ERS) is performed, a voltage Vee is provided to the erase line EL, the second n-well region NW2 and the second P-well region PW2, a voltage Vdd is provided to the word line WL and the select line SGL, and the ground voltage (0V) is provided to the control line CL, the bit line BL and the source line SL. The voltage Vee is an erase voltage, which has a high bias (e.g., 16V).

During the erase action, the select transistor Ms and the switch transistor Msw are turned on. In addition, the electrons stored in the floating gate FG are transferred through the gate oxide layer of the p-type transistor Mp and ejected from the floating gate FG through the erase line EL and the second N-well region NW2.

When the read action (READ) is performed, a voltage Vrr is provided to the bit line BL, the voltage Vdd is provided to the word line WL and the select line SGL, and the ground voltage (0V) is provided to the control line CL, the erase line EL, the source line SL and the second P-well region PW2. The voltage Vrr is a read voltage (e.g., 1V).

During the read action, the select transistor Ms and the switch transistor Msw are turned on. According to the number of electrons on the floating gate FG, the on/off state of the floating gate transistor Mf is determined. In case that the floating gate transistor Mf is turned on, a higher read current is generated and the read current flows from the bit line BL to the source line SL. Whereas, in case that the floating gate transistor Mf is turned off, a lower read current (or nearly zero) is generated. According to the magnitude of the read current, the storage state of the memory cell 600 is determined.

Figure 6D:
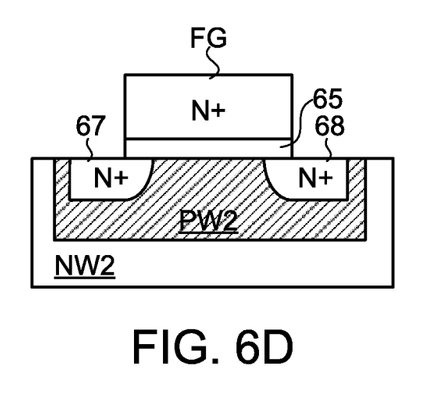
FIG. 6D is a schematic cross-sectional view illustrating an erase gate element of the MTP memory according to the eighth embodiment of the present invention and taken along the dotted line cd.

FIG. 6D is a schematic cross-sectional view illustrating an erase gate element of the MTP memory according to the eighth embodiment of the present invention and taken along the dotted line cd. The floating gate FG is formed on a gate oxide layer 65, and the gate oxide layer 65 is formed on a surface of the second P-well region PW2. After an n-type ion implantation process is performed, the gate electrode FG of the erase gate element becomes the n-type floating gate. In addition, the two n-type doped regions 67 and 68 are formed in the second P-well region PW2 and respectively arranged beside two opposite sides of the floating gate FG.

While the erase action is performed, electrons are stored in the n-type floating gate FGn, majority carriers and holes, are provided from the second P-well region PW2 to the channel region. Consequently, an electric field is built across the gate oxide layer 65. During the erase action, the electrons are transferred from the n-type floating gate FG to the second P-well region PW2 through the gate oxide layer 65.

Of course, the ion implantation process is not restricted to the n-type ion implantation process. For example, multiple ion implantation processes may be performed to form the erase gate element with a diverse structure.

Figure 7:
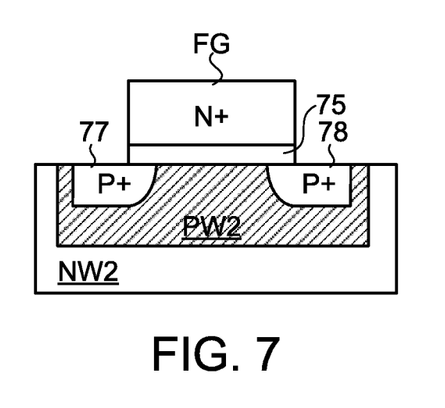
FIG. 7 is a schematic cross-sectional view illustrating an erase gate element of a MTP memory according to a ninth embodiment of the present invention.

FIG. 7 is a schematic cross-sectional view illustrating an erase gate element of a MTP memory according to a ninth embodiment of the present invention. Except for the erase gate element, the structure of the MTP memory of this embodiment is similar to the MTP memory of the eighth embodiment. Component parts and elements corresponding to those of the eighth embodiment are designated by identical numeral references, and detailed description thereof is omitted.

After an n-type ion implantation process is performed, the gate electrode FG of the erase gate element becomes an n-type floating gate. After a p-type ion implantation process is performed, two p-type doped regions 77 and 78 are formed in the second P-well region PW2 under a gate oxide layer 75 and respectively arranged beside two opposite sides of the n-type floating gate FG.

While the erase action is performed, electrons are stored in the n-type floating gate FG, majority carriers, and holes, are provided from the second P-well region PW2, the p-type doped region 77 and the p-type doped region 78 to the channel region. Consequently, an electric field is built across the gate oxide layer 75. During the erase action, the electrons are transferred from the n-type floating gate FG to the second P-well region PW2 through the gate oxide layer 75.

From the above descriptions, the present invention provides a MTP memory. In the erase gate element of the memory cell of the MTP memory, the floating gate FG overlying the gate oxide layer at least comprises a portion of the n-type floating gate FGn, and the underlying region of the gate oxide layer at least comprises a portion of the p-type region (e.g., a p-type doped region, a p-type implantation region or a P-well region). Consequently, the erase gate element has the faster erasing speed and the better erasing efficiency.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A multi-time programming non-volatile memory, comprising:
    a select transistor, wherein a gate terminal of the select transistor is connected with a select line, and a first source/drain terminal of the select transistor is connected with a source line;
    a floating gate transistor comprising a floating gate, wherein a first source/drain terminal of the floating gate transistor is connected with a second source/drain terminal of the select transistor; and
    an erase gate element connected with an erase line;
    wherein the erase gate element comprises:
    an n-type doped region;
    a p-type doped region;
    an n-type well region;
    a gate oxide layer disposed on a surface of the n-type well region; and
    the floating gate disposed over the gate oxide layer, wherein a first part of the floating gate is an n-type floating gate part, and a second part of the floating gate is a p-type floating gate part,
    wherein the n-type doped region is formed in the n-type well region and arranged beside the n-type floating gate part, and the p-type doped region is formed in the n-type well region and arranged beside the p-type floating gate part.

2. The multi-time programming non-volatile memory as claimed in claim 1, further comprises a switch transistor, wherein a gate terminal of the switch transistor is connected with a word line, a first source/drain terminal of the switch transistor is connected with a second source/drain terminal of the floating gate transistor, and a second source/drain terminal of the switch transistor is connected with a bit line.

3. The multi-time programming non-volatile memory as claimed in claim 1, further comprises a capacitor, wherein a first terminal of the capacitor is connected with the floating gate, and a second terminal of the capacitor is connected with a control line.

\* \* \* \* \*